(12) United States Patent
Yi et al.

(10) Patent No.: US 9,166,101 B2
(45) Date of Patent: Oct. 20, 2015

(54) LIGHT-EMITTING ELEMENT AND METHOD FOR MANUFACTURING SAME

(75) Inventors: Gyuchul Yi, Seoul (KR); Kunook Chung, Seoul (KR); Chulho Lee, Seould (KR)

(73) Assignee: SNU R&DB FOUNDATION, Seoul (KR)

( * ) Notice: Subject to any disclaimer, the term of this patent is extended or adjusted under 35 U.S.C. 154(b) by 53 days.

(21) Appl. No.: 13/877,951

(22) PCT Filed: Oct. 7, 2011

(86) PCT No.: PCT/KR2011/007461
§ 371 (c)(1),
(2), (4) Date: Apr. 5, 2013

(87) PCT Pub. No.: WO2012/047069
PCT Pub. Date: Apr. 12, 2012

(65) Prior Publication Data
US 2013/0187127 A1 Jul. 25, 2013

(30) Foreign Application Priority Data
Oct. 7, 2010 (KR) .......................... 10-2010-0097842

(51) Int. Cl.
*H01L 27/15* (2006.01)
*H01L 29/18* (2006.01)
(Continued)

(52) U.S. Cl.
CPC .............. *H01L 33/06* (2013.01); *H01L 33/007* (2013.01); *H01L 33/16* (2013.01); *H01L 33/40* (2013.01); *H01L 33/20* (2013.01); *H01L 33/42* (2013.01)

(58) Field of Classification Search
USPC ......... 977/902, 890, 950, 840, 888, 720, 892, 977/778, 891, 952, 701, 707, 833; 257/43, 257/13, 9, E21.09, 88, 103, 79, 77, 257/E33.005, 618, E27.07, E33.012, 257/E33.001, E33.064, 59, 72, E21.461, 257/431, E29.022, E31.002, E21.599, 257/E51.038, 443, 613, 615, 642, E21.114, 257/E23.111, E31.126, E33.055, E21.097, 257/E31.119, E31.13, E33.006, 918; 438/478, 29, 22, 46, 479, 455, 458, 438/584, 105, 795, 48, 694, 758, 44, 4, 81, 438/492, 763, 122, 41, 483, 503, 703, 73, 438/226, 363, 416, 496
See application file for complete search history.

(56) References Cited

U.S. PATENT DOCUMENTS

| 7,737,429 B2 | 6/2010 | Kim et al. |
| 7,858,876 B2 | 12/2010 | Lagally et al. |

(Continued)

FOREIGN PATENT DOCUMENTS

| KR | 10-2006-0038059 A | 5/2006 |
| KR | 10-2008-0102028 A | 11/2008 |

(Continued)

OTHER PUBLICATIONS

Korean Intellectual Property Office, International Search Report in International Patent Application No. PCT/KR2011/007461 (Apr. 10, 2012).

*Primary Examiner* — Chuong A Luu
*Assistant Examiner* — Cory Eskridge
(74) *Attorney, Agent, or Firm* — The PL Law Group, PLLC

(57) ABSTRACT

The present invention provides a light-emitting element comprising: a carbon layer comprising a graphene; a plurality of fine structures having grown toward the upper side of the carbon layer; a thin film layer for coating the fine structures; and a light-emitting structure layer formed on the thin film layer.

22 Claims, 13 Drawing Sheets

(51) Int. Cl.
*H01L 21/00* (2006.01)
*H01L 33/06* (2010.01)
*H01L 33/00* (2010.01)
*H01L 33/16* (2010.01)
*H01L 33/40* (2010.01)
*H01L 33/20* (2010.01)
*H01L 33/42* (2010.01)

(56) References Cited

U.S. PATENT DOCUMENTS 7,981,714 B2   7/2011  Kim et al.
2006/0091408 A1*  5/2006  Kim et al. ...................... 257/94
2008/0283821 A1  11/2008  Park et al.
2009/0269909 A1  10/2009  Kim et al.
2010/0132773 A1   6/2010  Lagally et al.
2012/0056237 A1*  3/2012  Choi et al. .................... 257/103
2013/0161584 A1*  6/2013  Crowder et al. ................. 257/9
2013/0187128 A1*  7/2013  Yi et al. ......................... 257/13

FOREIGN PATENT DOCUMENTS

KR   10-2009-0003526 A    1/2009
KR   10-2009-0123951 A   12/2009
KR   10-2010-0074442 A    7/2010

* cited by examiner (a)

(b)

(c)

LIGHT-EMITTING ELEMENT AND METHOD FOR MANUFACTURING SAME

TECHNICAL FIELD

The present invention relates to a light-emitting element and a method of manufacturing the same.

BACKGROUND ART

A light-emitting diode (LED) is an example of a light-emitting element. An LED is a device that emits light due to electron-hole pairs near a p-n junction or in an active layer by flowing current through a terminal of a compound semiconductor. Recently, advances in semiconductor technologies have led to rapid progress in producing high-quality LEDs. For example, technologies that implement a blue LED with high brightness by forming a III-V group nitride layer on a sapphire substrate using a metal-organic chemical vapor deposition (MOCVD) method are being commercialized.

As described above, a conventional LED has been manufactured by depositing a compound mainly on a sapphire substrate. However, although a sapphire substrate has an excellent light transmission property and mechanical strength, it also has disadvantages such as low thermal conductivity and difficulty in processing. In addition, a laser lift-off process is required to manufacture a vertical type light-emitting diode.

Graphene may be considered as a candidate material for replacing the sapphire substrate. Graphene is a monolayer of carbon atoms which are connected to form a honeycomb-shaped two-dimensional planar structure. An experimental method for obtaining graphene was first reported in 2004 by Ander K. Geim of Manchester University, who mechanically separated graphene from graphite. Since then, physical and chemical characteristics of graphene have been studied, and in recent years, technology for growing graphene on a large substrate having a size of to about 30 inches using chemical vapor deposition (CVD) has emerged. A material having a layered structure with two or more sheets of graphene is graphite. That is, a single layer separated from graphite is graphene.

Graphene has excellent thermal and electrical conductivity, high chemical/mechanical stability, and high transparency. In addition, graphene has high electron mobility, low resistivity, and a large surface area, and has an advantage over carbon nanotubes on a commercial front. Further, graphene or layer-structured graphite including graphene may be easily separated from an original substrate and transferred to another substrate.

In spite of the above-described merits, there have been limits in using graphene in a semiconductor device. In particular, since the surface of graphene is chemically very stable and non-reactive, it is very difficult to grow a microstructure or thin-film on graphene.

DISCLOSURE

Technical Problem

The present invention is directed to a light-emitting element including graphene and a method of manufacturing the same. However, the technical objectives of the present invention are not limited to the above disclosure; other objectives may become apparent to those of ordinary skill in the art based on the following descriptions.

Technical Solution

In accordance with an aspect of the present invention, a light-emitting element includes a carbon layer including graphene, a plurality of microstructures grown upward from the carbon layer, a thin-film layer covering the microstructures, and a light-emitting structure layer formed on the thin-film layer.

In accordance with another aspect of the present invention, a method of manufacturing a light-emitting element includes providing a carbon layer including graphene, growing a plurality of microstructures upward on the carbon layer, forming a thin-film layer covering the microstructures, and forming a light-emitting structure layer on the thin-film layer.

Advantageous Effects

The present invention provides a light-emitting element including graphene and a method of manufacturing the same. Specifically, the present invention includes forming microstructures on graphene, forming a thin-film layer covering the microstructures, and then forming a light-emitting structure layer on the thin-film layer. According to the present invention, it is possible to separate a light-emitting element to be transferred to a variety of substrates.

In addition, since the microstructures have excellent electrical and optical properties due to its excellent crystallinity, it is possible to manufacture a high-efficiency light-emitting element using a high-quality thin-film formed on the microstructures.

Further, since graphene has excellent electrical conductivity, it is possible to use graphene or graphite as a bottom electrode. Since graphene has excellent thermal conductivity, it is possible to avoid performance degradation of a light-emitting element due to the heat. Other effects of embodiments of the present invention are included in the detailed description and drawings.

BEST MODE FOR CARRYING OUT THE INVENTION

Figure 1A:
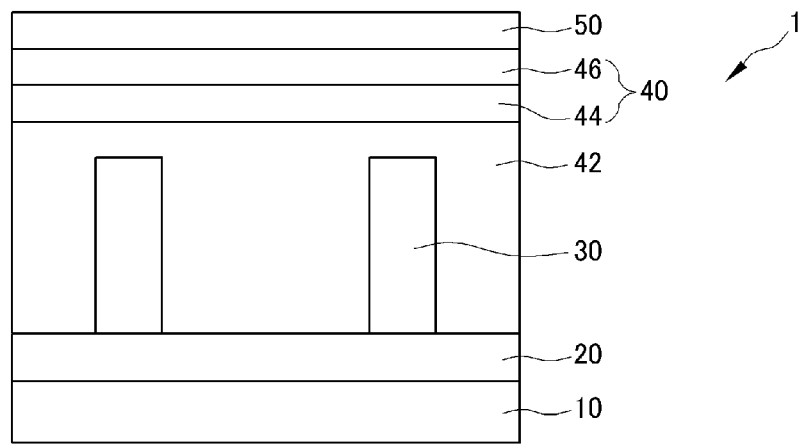
FIG. 1A is a cross-sectional view of a light-emitting element in accordance with an embodiment of the present invention.

Various embodiments will now be described more fully with reference to the accompanying drawings in which some embodiments are shown. These present inventions may, however, be embodied in different forms and should not be construed as limited to the embodiments set forth herein. Rather, these embodiments are provided so that this disclosure is thorough and complete and fully conveys the present invention to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. Further, it will be understood that when a layer (or film), a region, a pattern, or a structure is referred to as being "on" a substrate, a layer (or film), a region, a pad, or patterns, it can be directly on another layer or substrate, or intervening layers may also be present. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Hereinafter, embodiments of the present invention will be fully described with reference to the accompanying drawings.

Figure 1B:
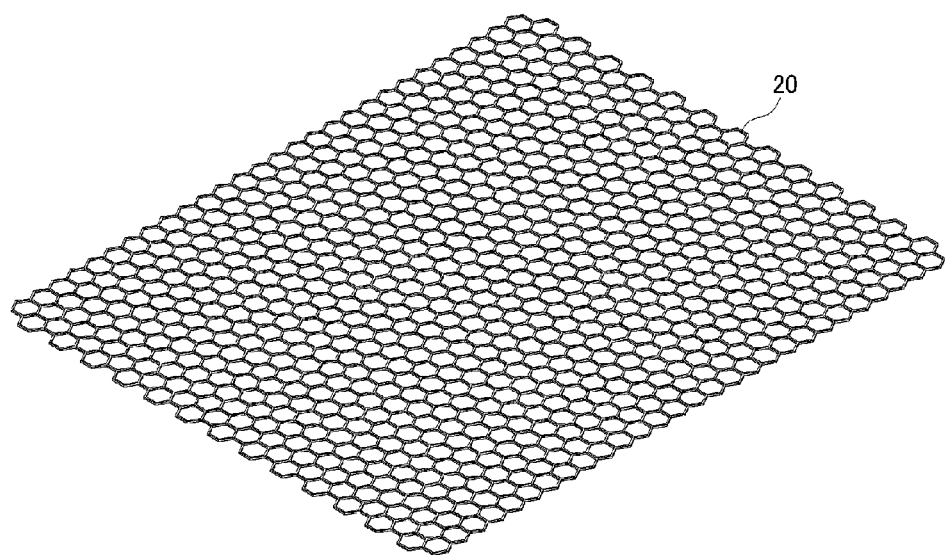
FIG. 1B is a schematic view showing graphene.
Figure 1C:
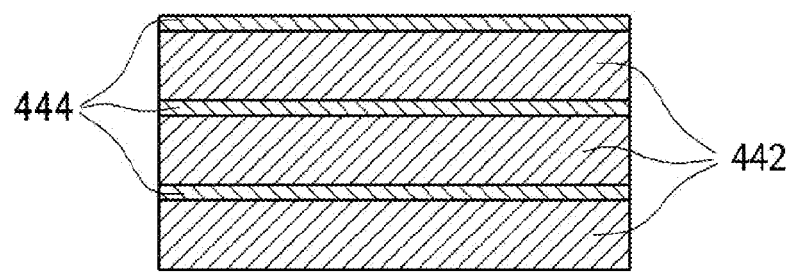
FIG. 1C is an enlarged cross-sectional view showing a quantum active layer.

FIG. 1A is a cross-sectional view of a light-emitting element in accordance with an embodiment of the present invention, FIG. 1B is a schematic view showing graphene, and FIG. 1C is an enlarged cross-sectional view showing a quantum active layer.

Referring to FIG. 1A, a light-emitting element 1 may include a substrate 10, a carbon layer 20, microstructures 30, a thin-film layer 42, a light-emitting structure layer 40, and a first electrode layer 50.

The substrate 10 may be a metal, a glass, a resin, or any other material. For example, the substrate 10 may include Si, SiC, GaAs, spinel, InP, GaP, AlP, GaN, InN, AlN, ZnO, MgO, AlO, TiO, sapphire, quartz, or a pirex, but is not limited thereto.

The carbon layer 20 may be disposed on the substrate 10. However, when the carbon layer 20 has sufficient mechanical strength, the substrate 10 may not be absolutely necessary, and the carbon layer 20 itself may function as a substrate without using the extra substrate 10.

In addition, the carbon layer 20 may be separable from the substrate 10. Therefore, the carbon layer 20 and other structures thereon may be separated from the substrate 10 and transferred. This will be described in detail later.

The carbon layer 20 may include one or more graphene layers. Graphene is a material with a two-dimensional planar structure in which carbon atoms are connected to each other to form a honeycomb shape, as shown in FIG. 1B. Graphene may have various structures, which depends on the content of five-membered rings and/or seven-membered rings included in the graphene.

A plurality of the microstructures 30 may be placed at arbitrary points on the carbon layer 20. The microstructures 30 are approximately micro- or nano-scale structures, and there is no particular limit on the size or shape thereof. In addition, the microstructures 30 may be formed by growing upward from the carbon layer 20. This means that the microstructures 30 are not required to be formed perpendicular to the carbon layer 20 but formed by a bottom up method in which the microstructures 30 are stacked upward with respect to a plate surface of the carbon layer 20 from a part in contact with the carbon layer 20 as a starting point.

The microstructures 30 manufactured by the bottom-up method may grow into an excellent crystalline material having very low dislocation density, in spite of the difference in material constant (e.g., lattice constant or thermal expansion coefficient) from the carbon layer 20. Accordingly, the microstructures 30 formed by the bottom-up method may have superior crystalline, electrical, and optical characteristics to the structure manufactured by a top-down method based on thin-film deposition and etching processes. Accordingly, the thin-film layer 42 formed on the microstructures 30 may also have excellent electrical and optical characteristics, and therefore a high-efficiency light-emitting element 1 may be manufactured.

The microstructures 30 may be grown upward from damages formed in the carbon layer 20, and detailed description thereto will be given later.

There is no particular limit on the material used for the microstructures 30, and ZnO, ZnMgO, ZnCdO, ZnMgCdO, ZnBeO, ZnMgBeO, ZnMnO, ZnMgMnO, GaN, AlN, GaAlN, or InGaN may be used, for example.

Figure 7A:
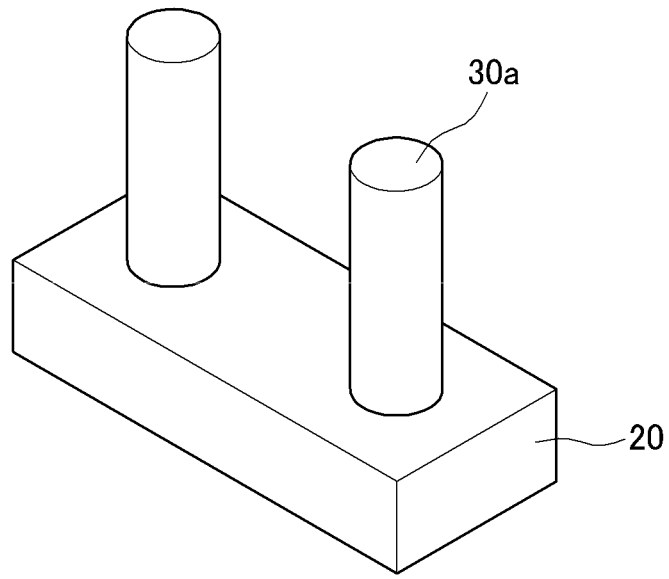
FIGS. 7A to 7E are perspective views showing various shapes of microstructures.
Figure 7B:
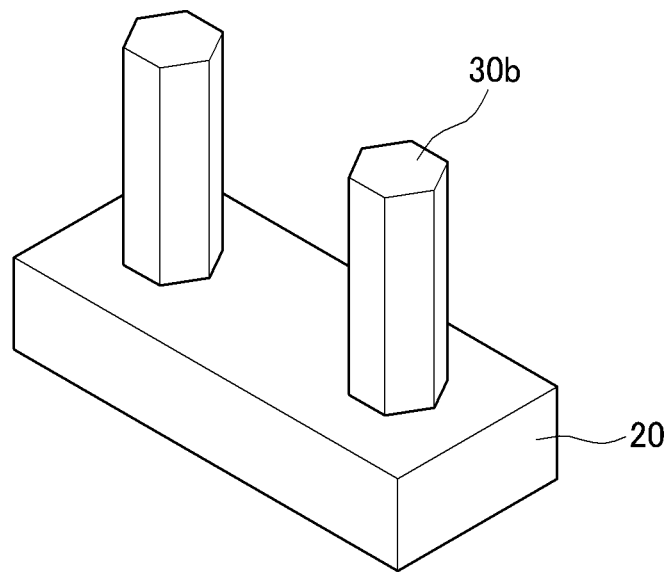
Figure 7C:
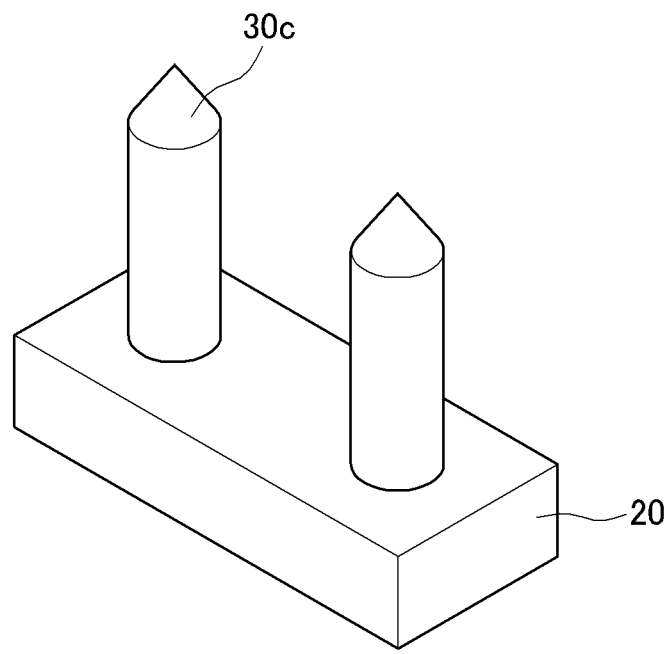
Figure 7D:
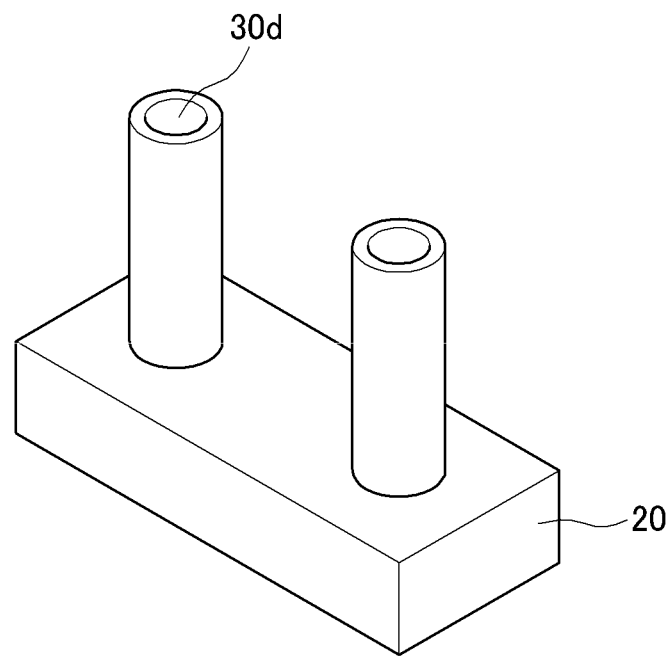
Figure 7E:
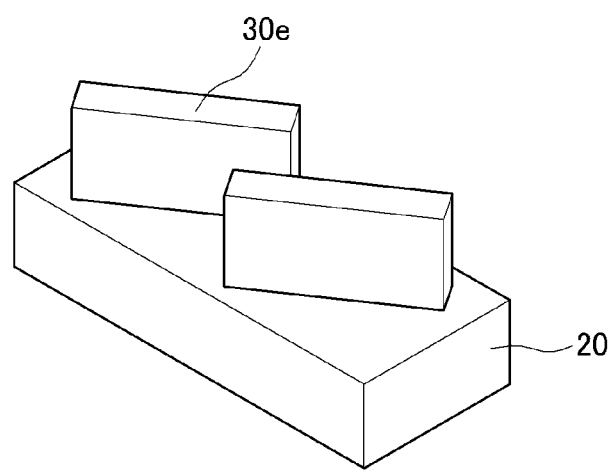

There is no particular limit on the shape of microstructures 30 and, for example, a cylindrical micro-bar 30a illustrated in FIG. 7A, a polyprism-shaped micro-bar 30b illustrated in FIG. 7B, a micro-needle 30c illustrated in FIG. 7C, a micro-tube 30d illustrated in FIG. 7D, and a micro-wall 30c illustrated in FIG. 7E may be possible.

The thin-film layer 42 may be formed to cover the microstructures 30. That is, the microstructures 30 and the thin-film layer 42 may be prepared in such a way that the microstructures 30 are inserted in the thin-film layer 42. The microstructures 30 may function as a kind of a seed layer for forming the thin-film layer 42. Although it is difficult to form a thin film on graphene or graphite, it is easy to form the microstructures 30 on the graphene or graphite and then to form the thin-film layer 42 using the microstructures 30 as a seed.

A nitride such as GaN or an oxide such as ZnO may be used as a material of the thin-film layer 42, but the present invention is not limited thereto. The thin-film layer 42 may be preferably formed of a material having a similar crystal structure and lattice constant to the microstructures 30, in order to match the microstructures 30. In addition, the thin-film layer 42 may be formed of a structural layer for emitting light, for example, an n-type semiconductor layer. The n-type semiconductor layer may be manufactured of a semiconductor material doped with n-type impurities. Si, Ge, Se, Te, or C may be used as the n-type impurities, and GaN, AlN, GaAlN, or InGaN may be used as the semiconductor material. However, the present invention is not limited thereto.

The light-emitting structure layer 40 may be disposed on the thin-film layer 42. The light-emitting structure layer 40 may be formed in a multi-layered thin-film structure, and include, for example, a quantum active layer 44 and a p-type semiconductor layer 46. On the other hand, when the thin-film layer 42 is formed of an n-type semiconductor layer, the thin-film layer 42, the quantum active layer 44, and the p-type semiconductor layer 46 may configure a light-emitting structure layer. The light-emitting structure layer may also be called a semiconductor layer or a light-emitting hetero-junction.

The quantum active layer 44 may be formed on a surface of the thin-film layer 42 and emit light due to an applied voltage. Specifically, the quantum active layer 44 may be configured by alternately stacking a plurality of quantum barrier layers 442 and a plurality of quantum well layers 444 (see FIG. 1C), and have characteristics of emitting light by the recombination of electrons and holes. The quantum barrier layer 442 may be formed of GaN, InGaN, AlN, GaAlN, ZnO, ZnMgO, ZnCdO, ZnMgCdO, ZnBeO, ZnMgBeO, ZnMnO, or ZnMgMnO, but is not limited thereto. In addition, the quantum well layer 444 may be formed of GaN, InGaN, AlN, GaAlN, ZnO, ZnMgO, ZnCdO, ZnCdO, ZnMgCdO, ZnBeO, ZnMgBeO, ZnMnO, or ZnMgMnO, but is not limited thereto.

The p-type semiconductor layer 46 may be formed on a surface of the quantum active layer 44, and formed of a semiconductor material doped with p-type impurities. Mg, Zn, or Be may be used as the p-type impurities, and GaN, AlN, GaAlN, or InGaN may be used as the semiconductor material, but the present invention is not limited thereto.

The first electrode layer 50 may be formed on the light-emitting structure layer 40. The first electrode layer 50 may be formed of a conductive material, for example, a metal such as Au, Ni, Ti, or Cr, a transparent conductive oxide (TCO) such as indium tin oxide (ITO), indium zinc oxide (IZO), aluminum zinc oxide (AZO), or indium zinc tin oxide (IZTO), a conductive polymer, or graphene, etc. The light-emitting element 1 may emit light by connecting the first electrode layer 50, the carbon layer 20, or a second electrode layer 70 (will be described later) to an external power source through a lead, etc.

As described above, the light-emitting element in accordance with the embodiment of the present invention may have dramatically improved physical/chemical properties by using the carbon layer 20 including graphene. This is due to characteristics of graphene described as follows.

First, graphene has excellent electrical conductivity. Accordingly, the carbon layer 20 itself which includes graphene may be used as an electrode, and the contact resistance may be small even when a separate electrode is installed in the carbon layer 20. When the carbon layer 20 itself is used as the electrode, the process time and cost may be reduced since the structure is relatively simple compared to when an extra electrode is installed.

In addition, graphene has superior thermal conductivity. Accordingly, since the heat dissipation characteristics of the light-emitting element 1 are excellent, it is easy to manufacture a high-power device. This is one of characteristics that is especially superior to a light-emitting element based on a sapphire substrate in the related art.

In addition, graphene has excellent chemical and mechanical stability, and especially has flexibility and ductility. In addition, the carbon layer 20 including graphene may be manufactured to be transparent.

Further, graphene and structures thereon may be separated from the substrate 10 to be transferred. When a light-emitting diode is manufactured in the related art, there is a limitation in selecting a substrate in a material preparation process (e.g. growth, deposition, etc.) due to the material constant. However, there is no limitation in selecting a substrate in the present invention because graphene is easily separated and transferred. That is, the graphene and the structure thereon may be separated from an original substrate and transferred onto another substrate having desired properties. For example, it can be freely transferred to a polymer substrate which is flexible and deformable, a transparent substrate, or a substrate with excellent thermal conductivity.

Further, since electrons are transported along the elongated microstructures 30 extending on the carbon layer 20, the transport efficiency is excellent. In addition, since the first electrode layer 50 and the light-emitting structure layer 40 form a face-to-face contact, the contact resistance may decrease.

FIGS. 2 to 5 are cross-sectional views showing a light-emitting element in accordance with another embodiment of the present invention. In FIGS. 2 to 5, the same reference numerals will be used to refer to the same or similar components described in the previous embodiment, and a duplicate description will be omitted.

Figure 2:
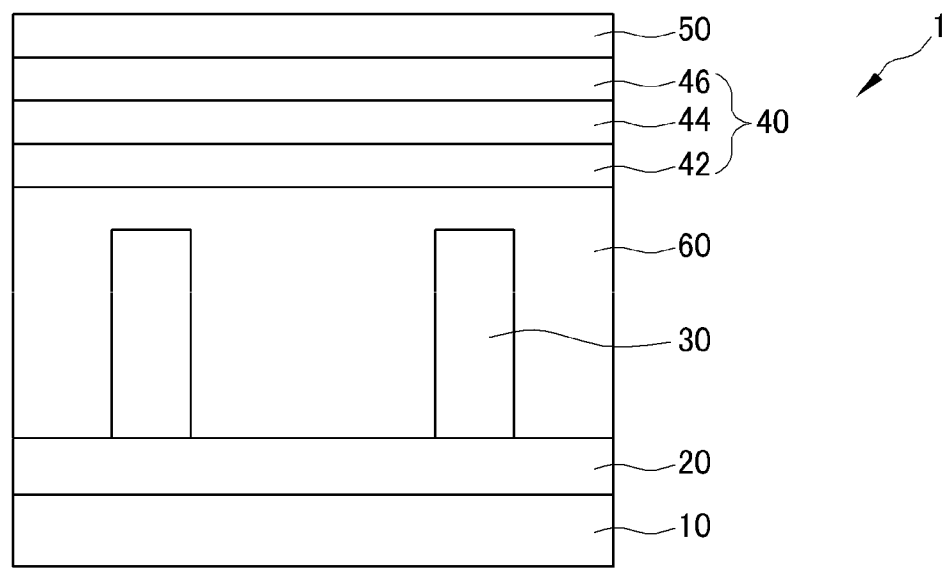
FIGS. 2 to 6 are cross-sectional views showing a light-emitting element in accordance with another embodiment of the present invention.

First, referring to FIG. 2, a thin-film layer 60 covering microstructures 30 may be formed, and a light-emitting structure layer 40 may be formed on the thin-film layer 60 in this embodiment. This embodiment is different from the previous embodiment in that the thin-film layer 60 is not an n-type semiconductor layer. That is, the light-emitting structure layer 40 may include an n-type semiconductor layer 42, a quantum active layer 44, and a p-type semiconductor layer 46.

Figure 3:
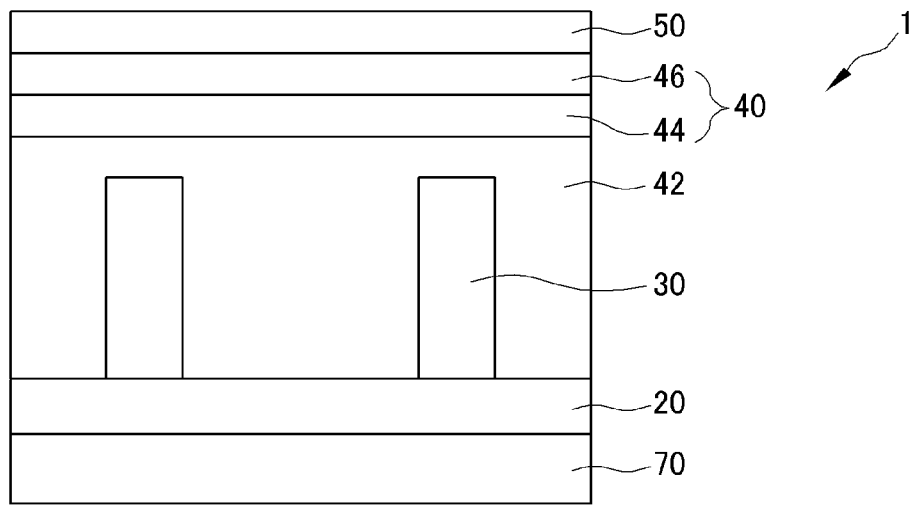

Next, as shown in FIG. 3, a second electrode layer 70 may be formed on a bottom surface of the carbon layer 20. Since the second electrode layer 70 forms a face-to-face contact with the carbon layer 20, contact resistance may be small. The second electrode layer 70, similar to the first electrode layer 50, may be formed of a conductive material, for example, a metal such as Au, Ni, Ti, or Cr, a transparent conductive oxide (TCO) such as indium tin oxide (ITO), indium zinc oxide (IZO), aluminum zinc oxide (AZO), or indium zinc tin oxide (IZTO), a conductive polymer, or graphene, etc.

Figure 4:
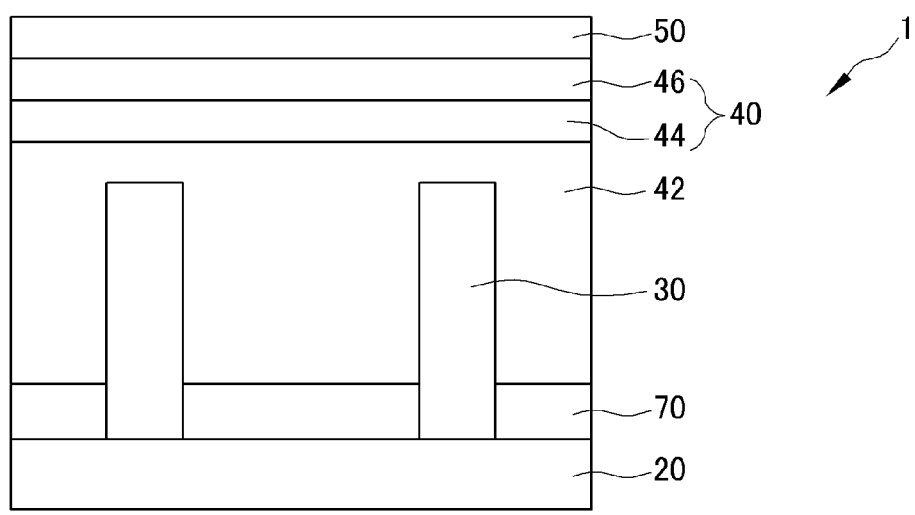

In another embodiment, as shown in FIG. 4, the second electrode layer 70 may be formed between the carbon layer 20 and the thin-film layer 42.

Figure 5:
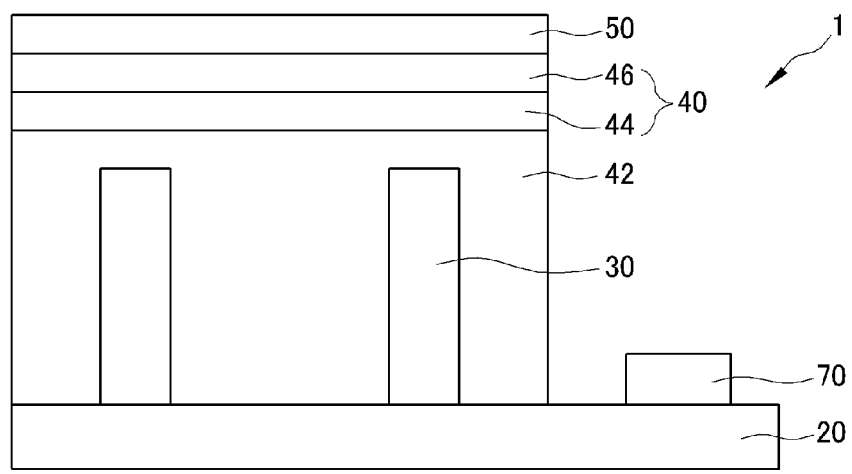

In still another embodiment, as shown in FIG. 5, the second electrode layer 70 may be formed not between the carbon layer 20 and the thin-film layer 42, but at a separate area on a top surface of the carbon layer 20.

Figure 6:
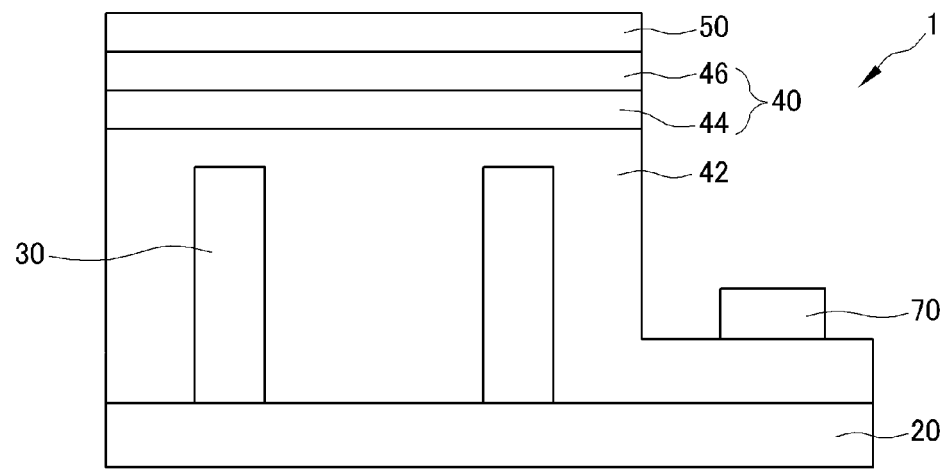

Meanwhile, although it is described in all the previous embodiments of the present invention that the second electrode layer 70 is formed in contact with the carbon layer 20, the second electrode layer 70 may be formed to be in contact with the thin-film layer 42, which is an n-type semiconductor layer, without being in contact with the carbon layer 20. For example, as shown in FIG. 6, the thin-film layer 42 may be formed to have a step difference, and the second electrode layer 70 may be formed on a portion of the thin-film layer 42 in which the light-emitting structure layer 40 is not formed.

Meanwhile, although it is described in all the previous embodiments of the present invention that the thin-film layer 42 is the n-type semiconductor layer and the light-emitting structure layer 40 is configured of the quantum active layer 44 and the p-type semiconductor layer 46, the present invention is not limited thereto. For example, when the thin-film layer 42 is formed of an n-GaN layer (a kind of n-type semiconductor layer), and the light-emitting structure layer 40 includes an InGaN layer and a p-GaN layer (a kind of p-type semiconductor layer), an undoped GaN layer may be formed between the light-emitting structure layer 40 and the n-GaN layer in order to improve lattice matching between the light-emitting structure layer 40 and the n-GaN layer, and a metal layer for forming an ohmic contact may be formed between the p-GaN layer and the first electrode layer 50 in order to flow current between the p-GaN layer and the first electrode layer 50.

Further, it is also possible for the thin-film layer 42 to be a p-type semiconductor layer, and the light-emitting structure layer 40 to be configured of a quantum active layer and an n-type semiconductor layer.

In still another embodiment, the first electrode layer 50 may be formed only on a part of the p-type semiconductor layer 46 (not shown). When the first electrode layer 50 is formed only on a part of the p-type semiconductor layer 46, the area in which the first electrode layer 50 is not disposed may function as a light-emitting pathway, which is particularly useful when the first electrode layer 50 is not transparent. In addition, although not shown, the second electrode layer 70 may also be formed at only a part of a surface of the carbon layer 20. The first electrode layer 50 and/or the second electrode layer 70 may be formed in a grid shape.

Figure 8A:
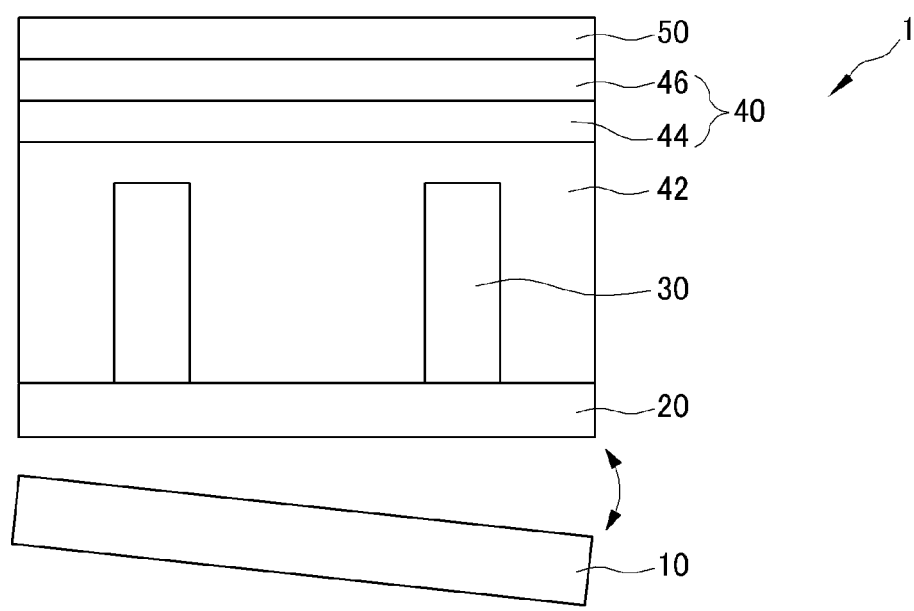
FIGS. 8A and 8B are schematic views showing a transfer process of graphene.
Figure 8B:
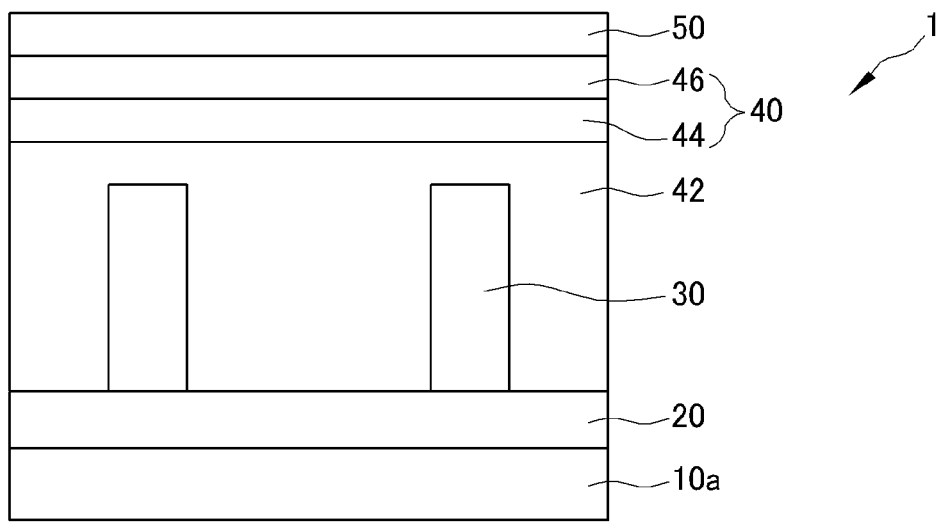

FIGS. 8A and 8B are schematic views showing a transfer process of graphene. As described above, graphene is easily separated from a substrate to be transferred. That is, the carbon layer 20 and the structures thereon may be separated from the lower substrate 10 (see FIG. 8A), and the separated carbon layer 20 and structures thereon may be transferred to another substrate 10a (see FIG. 8B). The carbon layer 20 and the substrate 10 may be separated by only a mechanical force, which is called mechanical lift-off. It has been experimentally proven that the carbon layer 20 and the structures thereon are separated from a substrate by a mechanical lift-off and transferred to another substrate such as a sapphire substrate, a glass substrate, a metal substrate, or a polymer substrate.

When the carbon layer 20 includes multi-layered graphene, the carbon layer 20 itself may be separated into single-layered graphene and the rest of the carbon layer 20.

So far, the configuration of the light-emitting element in accordance with an embodiment of the present invention has been described. Hereinafter, a method of manufacturing a light-emitting element in accordance with an embodiment of the present invention will be described with reference to accompanying drawings.

FIGS. 9A to 9G are cross-sectional views sequentially showing process steps for manufacturing a light-emitting element in accordance with an embodiment of the present invention.

Figure 9A:
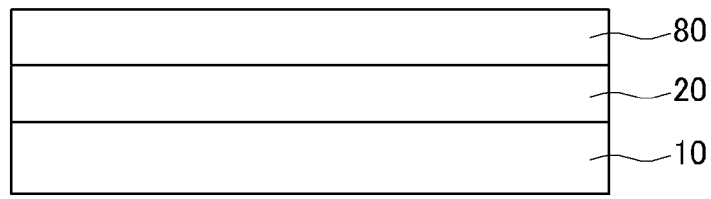
FIGS. 9A to 9G are cross-sectional views sequentially showing process steps for manufacturing a light-emitting element in accordance with an embodiment of the present invention.

First, as shown in FIG. 9A, a substrate 10 on which a carbon layer 20 including graphene is formed may be prepared, and a mask layer 80 may be formed on the carbon layer 20. The carbon layer 20 including graphene may be formed on the substrate 10 by a chemical vapor deposition (CVD) method, but the present invention is not limited thereto. For example, the graphene may be used by being mechanically or chemically separated from single crystalline graphite. As the CVD method, a rapid thermal chemical vapor deposition (RTCVD) method, a plasma-enhanced chemical vapor deposition (PECVD) method, an inductively coupled plasma-enhanced chemical vapor deposition (ICPCVD) method, and a metal-organic chemical vapor deposition (MOCVD) method may be used, as well as a normal CVD method.

In this embodiment, the carbon layer 20 is described as being located on the substrate 10, but the carbon layer 20 itself may be used as a substrate without using the substrate 10.

Figure 9B:
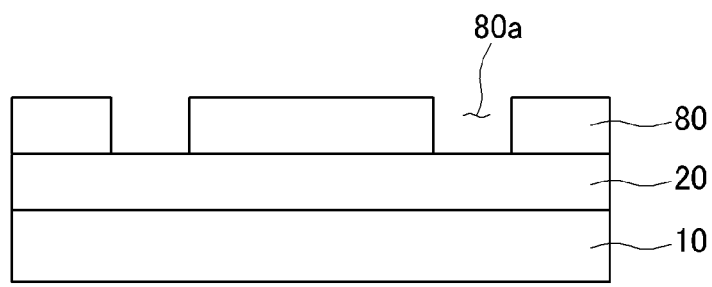

Next, as shown in FIG. 9B, the mask layer 80 may be patterned to form a plurality of openings 80a. The method of patterning the mask layer 80 is well known in the field of semiconductor manufacturing processes, and a method such as e-beam lithography, photolithography, laser interference lithography, or nano-imprinting may be used. In addition, a patterning method using a template such as an anodic aluminum oxide or block copolymer may be used.

Figure 9C:
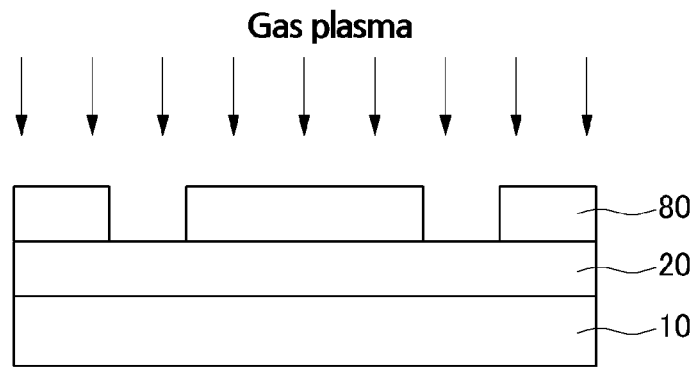

Next, as shown in FIG. 9C, damages (not shown) may be generated in a surface of the carbon layer 20 through the openings 80a formed in the mask layer 80. The damages may be generated using a gas plasma as shown in FIG. 9C, or using an ion-beam, an electron beam, a proton beam, or a neutron beam, but are not limited thereto. Gas for the gas plasma may be $O_2$, $N_2$, $Cl_2$, H, Ar, $CF_4$, $SF_6$, $BCl_3$, or ozone, etc., but is not limited thereto.

Figure 9D:
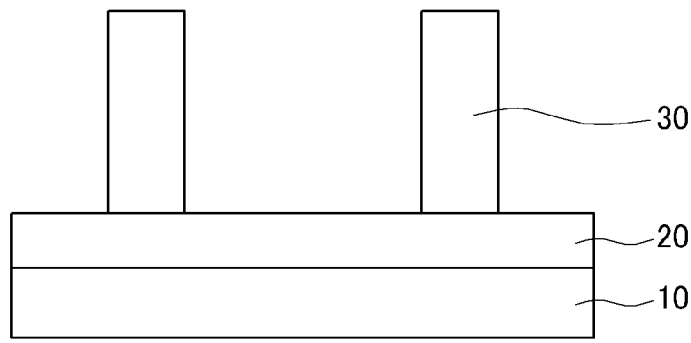

Next, as shown in FIG. 9D, the mask layer 80 may be removed after the microstructures 30 are grown from the damages.

As a method of growing the microstructures 30 on the carbon layer 20, a CVD method including an MOCVD method, a physical deposition method such as sputtering, thermal or electron beam evaporation, and pulsed laser deposition, or a vapor-phase transport process using a metal catalyst such as Au may be used. When using a catalyst-free MOCVD method in which the catalyst is not used, it is possible to avoid contamination due to the catalyst and manufacture the microstructures 30 showing excellent electrical and optical performance.

Generally, since the surface of graphene is chemically very stable and has low reactivity, it is difficult to grow a thin-film or microstructure on graphene. That is, since materials are grown only from surface defects or step edges of graphene, it is difficult to form a microstructure at a desired level in the related art.

However, according to the method of manufacturing a light-emitting element in accordance with the embodiment of the present invention, by intentionally forming damages on the surface of graphene, nucleation and growth may occur from the damage as a beginning point. Therefore, it is possible to form microstructures on graphene, and furthermore, it is easy to control the location and density of the microstructures.

Although the location and density of the microstructures 30 are controlled by patterning and generation of the damages above, the present invention is not limited thereto. For example, the damages may be arbitrarily formed on the carbon layer 20 by directly performing gas-plasma etching on the carbon layer 20 without using the mask layer 80. In addition, it is possible to inject an ion-beam onto the carbon layer 20 without using the mask layer 80. In this case, the location and density of the microstructures 30 may be controlled by adjusting the injection position of the ion-beam, without using the mask layer 80.

In addition, it is not absolutely required to generate damages on the carbon layer 20 and grow the microstructures 30 from the damages. For example, the microstructures 30 may be directly grown on the carbon layer 20 by adjusting process conditions such as temperature and pressure.

Figure 9E:
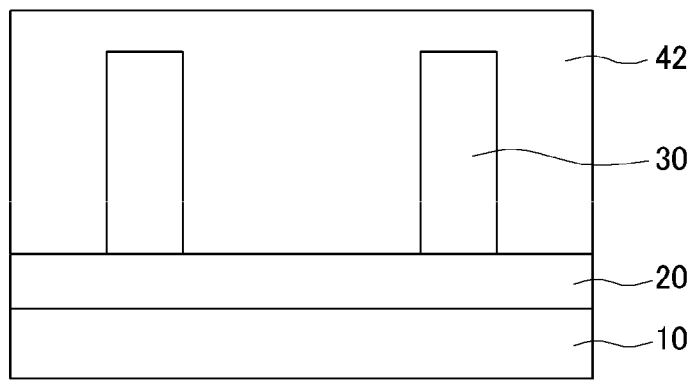

Next, as shown in FIG. 9E, a thin-film layer 42 may be formed to fully cover the microstructures 30.

Figure 9F:
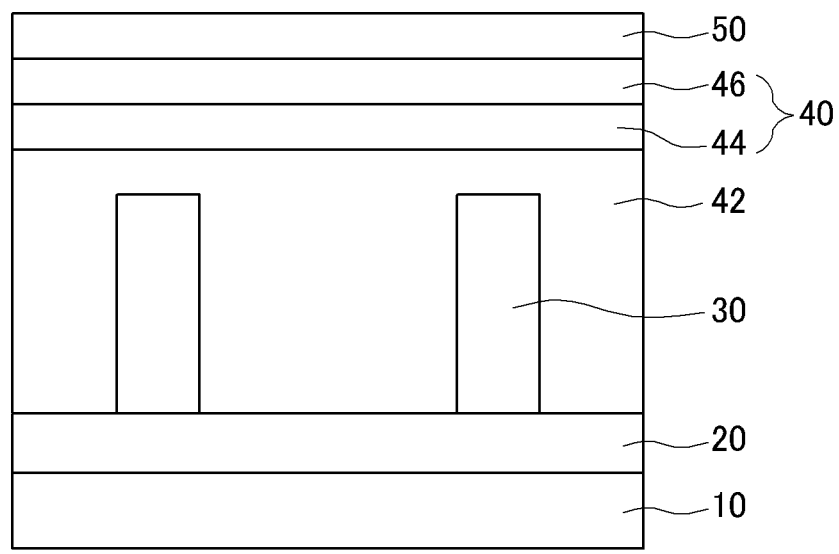

Next, as shown in FIG. 9F, a light-emitting structure layer 40 and a first electrode layer 50 may be sequentially formed on a surface of the thin-film layer 42. The formation of the light-emitting structure layer 40 may include forming a quantum active layer 44 on the surface of the thin-film layer 42 and forming a p-type semiconductor layer 46 on a surface of the quantum active layer 44.

Figure 9G:
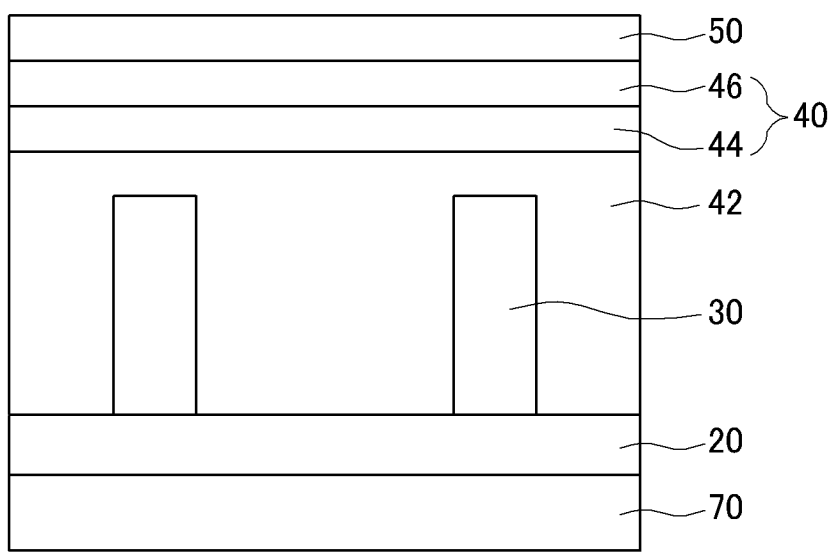

Finally, as shown in FIG. 9G, the substrate 10 disposed on a bottom surface of the carbon layer 20 may be removed, and a second electrode layer 70 may be formed.

Although the method of manufacturing a light-emitting element in accordance with the embodiment of the present invention has been described above, the present invention is not limited to this embodiment. For example, the carbon layer 20 itself including the graphene may be used as an electrode without forming the second electrode layer 70.

In addition, the second electrode layer 70 may be disposed between the carbon layer 20 and the thin-film layer 42. Further, the second electrode layer 70 may be formed not between the carbon layer 20 and the thin-film layer 42 but at a separate area on a top surface of the carbon layer 20. Further, the second electrode layer 70 may be formed on the thin-film layer 42.

<Experimental Embodiment>

A light-emitting element was manufactured using a method of manufacturing a light-emitting element in accordance with an embodiment of the present invention.

Figure 10:
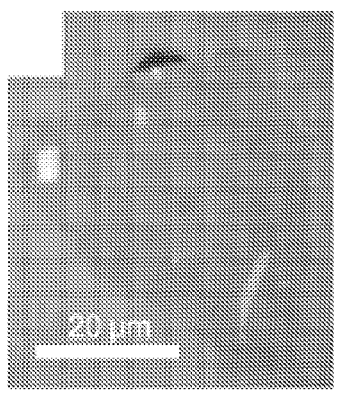
FIG. 10A is an optical microscope photograph of graphene treated by oxygen plasma.
FIG. 10B is a scanning electron microscope (SEM) image showing ZnO microstructures grown on graphene.
FIG. 10C is a scanning electron microscope (SEM) image showing a GaN thin-film layer covering ZnO microstructures.
Figure 10:
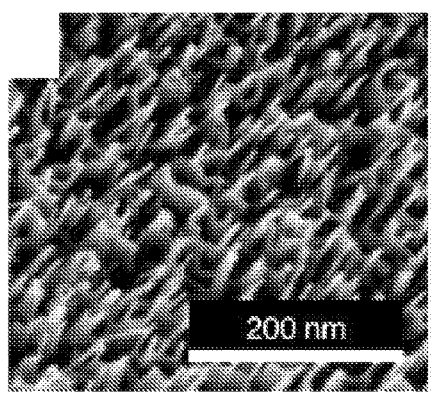
Figure 10:
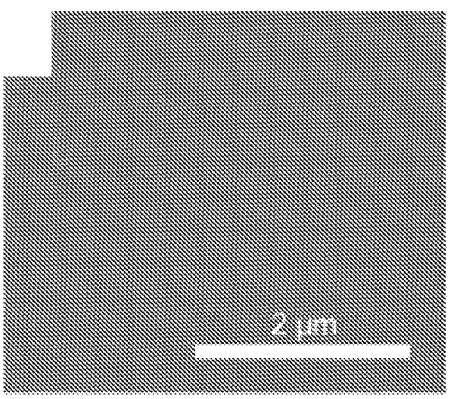

First, graphene is physically separated from single crystalline graphite powder, and then transferred to a sapphire substrate. Next, the graphene is treated with oxygen plasma (oxygen partial pressure: 100 mTorr, current supply: 50 mA). FIG. 10A is an optical microscope photograph of graphene treated with the oxygen plasma.

Next, ZnO microstructures may be formed on the graphene by a catalyst-free MOCVD method. High-purity diethyl-zinc and oxygen are supplied as reactants for the growth of ZnO. High-purity argon is used as a carrier gas. FIG. 10B is a scanning electron microscope (SEM) image showing ZnO microstructures grown on the graphene.

Next, a GaN thin-film layer is stacked to cover the microstructures. FIG. 10C is an SEM image showing the GaN thin-film layer covering the ZnO microstructures.

Next, a light-emitting structure layer having a GaN-based p-n homojunction is formed on the GaN thin-film layer. More specifically, a Si-doped n-GaN layer, a third group GaN/InxGa1-xN multiple quantum well (MQW; quantum active layer), and a Mg-doped p-GaN layer form a coaxial junction with the ZnO microstructures.

Figure 11:
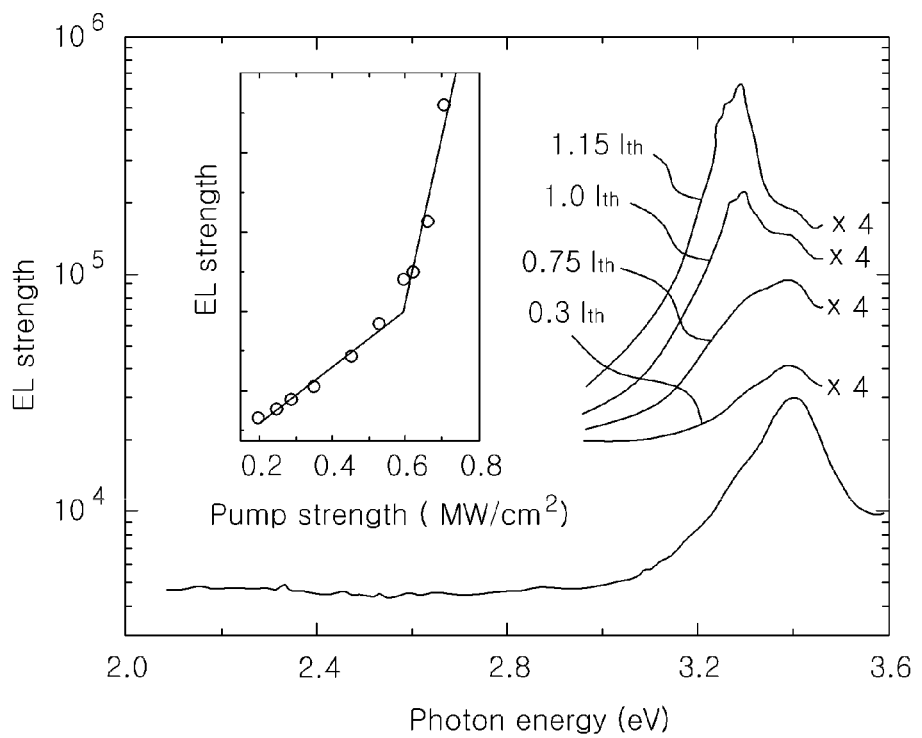
FIG. 11 is a graph showing a room-temperature photoluminescence spectrum of a ZnO thin-film layer in a light-emitting element in accordance with an embodiment of the present invention.

FIG. 11 is a graph showing a room-temperature photoluminescence spectrum of a ZnO thin-film layer in a light-emitting element in accordance with an embodiment of the present invention. A peak point of photoluminescence is shown at 3.4 eV.

Figure 12:
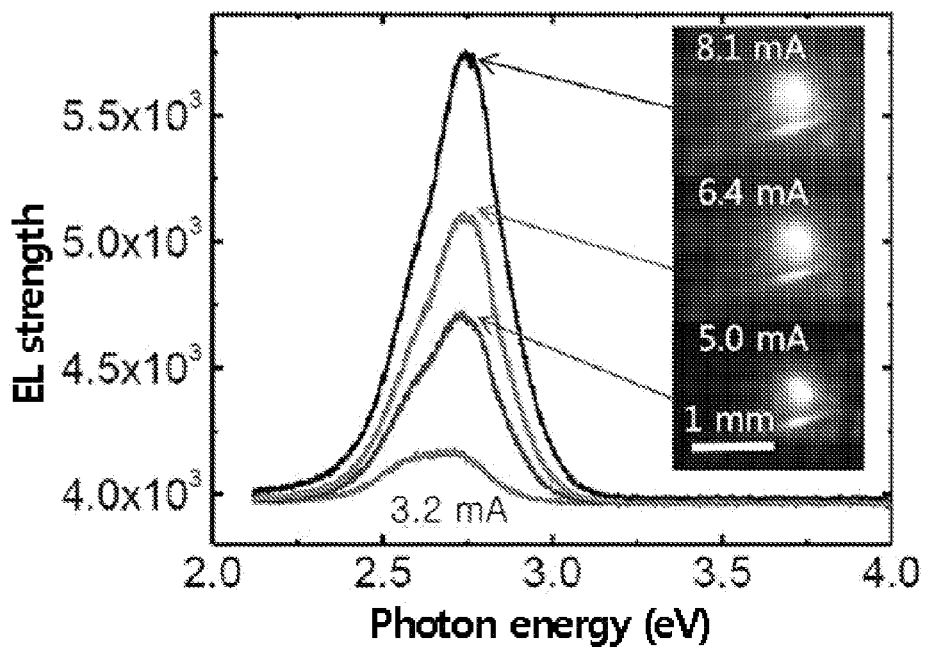
FIG. 12 is a graph showing an electroluminescence spectrum measured according to various applied voltages in a light-emitting element in accordance with an embodiment of the present invention.

FIG. 12 is a graph showing an electroluminescence spectrum measured according to various applied voltages in a light-emitting element in accordance with an embodiment of the present invention. As the applied current increases from 1.7 mA to 8.1 mA, the peak point of the electroluminescence shifts from 2.71 eV to 2.75 eV.

Figure 13:
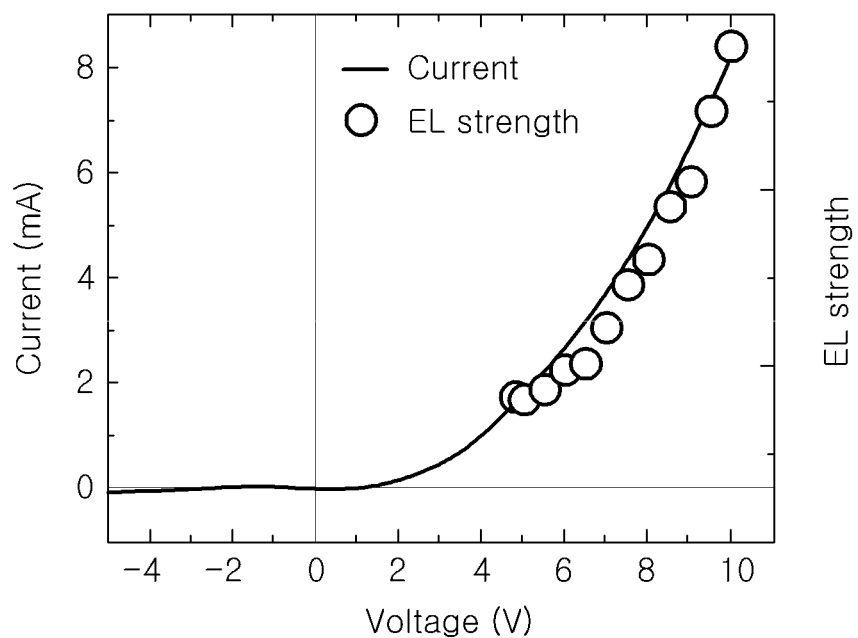
FIG. 13 is a graph showing current-voltage characteristic curve of a light-emitting element in accordance with an embodiment of the present invention.

FIG. 13 is a graph showing a current-voltage characteristic curve of a light-emitting element in accordance with an embodiment of the present invention. Rectifying characteristics are shown at a turn-on voltage of 4.5 V, and the leakage current measured at −4 V is $1 \times 10^{-5}$ A.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this present invention as defined in the claims.

In the claims, means-plus-function clauses are intended to cover the structures described herein as performing the recited function, and not only structural equivalents but also equivalent structures.

The invention claimed is:

1. A light-emitting element, comprising:
   a carbon layer including graphene;
   a plurality of microstructures grown upward from the carbon layer;
   a thin-film layer covering the microstructures; and
   a light-emitting structure layer formed on the thin-film layer.

2. The light-emitting element of claim 1, further comprising:
   a first electrode layer formed on the light-emitting structure layer.

3. The light-emitting element of claim 1 or 2, further comprising:
   a substrate disposed below the carbon layer.

4. The light-emitting element of claim 3, wherein the carbon layer and the substrate are separable.

5. The light-emitting element of claim 1 or 2, wherein the microstructures are grown upward from damages formed in the carbon layer.

6. The light-emitting element of claim 1 or 2, further comprising:
   a second electrode layer formed on a surface of the carbon layer.

7. The light-emitting element of claim 1 or 2, wherein the microstructures comprise a structure selected from the group consisting of a micro-bar, a micro-needle, a micro-tube, and a micro-wall.

8. The light-emitting element of claim 1 or 2, wherein the light-emitting structure layer comprises an n-type semiconductor layer, a p-type semiconductor layer, and a quantum active layer disposed between the n-type semiconductor layer and the p-type semiconductor layer.

9. The light-emitting element of claim 8, wherein the n-type semiconductor layer comprises gallium nitride, aluminum nitride, gallium aluminum nitride, or indium gallium nitride doped with one or more impurities selected from the group consisting of silicon, germanium, selenium, tellurium, and carbon, and the p-type semiconductor layer comprises gallium nitride, aluminum nitride, gallium aluminum nitride, or indium gallium nitride doped with one or more impurities selected from the group consisting of magnesium, zinc, and beryllium.

10. The light-emitting element of claim 1 or 2, wherein the microstructures comprise one or more elements selected from the group consisting of zinc oxide, zinc-magnesium oxide, zinc-cadmium oxide, zinc-magnesium-cadmium oxide, zinc-beryllium oxide, zinc-magnesium-beryllium oxide, zinc-manganese oxide, zinc-magnesium-manganese oxide, gallium nitride, aluminum nitride, gallium aluminum nitride, and indium gallium nitride.

11. The light-emitting element of claim 1 or 2, wherein the thin-film layer comprises an n-type semiconductor layer, and the light-emitting structure layer comprises a quantum active layer and a p-type semiconductor layer.

12. A method of manufacturing a light-emitting element, comprising:
   providing a carbon layer including graphene;
   growing a plurality of microstructures upward on the carbon layer;
   forming a thin-film layer covering the microstructures; and
   forming a light-emitting structure layer on the thin-film layer.

13. The method of claim 12, further comprising:
   forming a first electrode layer on the light-emitting structure layer after forming the light-emitting structure layer.

14. The method of claim 12 or 13, wherein the providing of the carbon layer comprises providing a carbon layer including the graphene on a substrate.

15. The method of claim 12 or 13, wherein the growing of the microstructures comprises:
    generating damages on the carbon layer; and
    growing the microstructures upward from the damages.

16. The method of claim 15, wherein the generating of the damages comprises:
    forming a mask layer on the carbon layer;
    forming a plurality of openings by patterning the mask layer; and
    forming damages on the carbon layer through the openings.

17. The method of claim 15, wherein the generating of the damages comprises using one or more methods among a gas plasma, an ion-beam, an electron beam, a proton beam, and a neutron beam.

18. The method of claim 16, wherein the forming of the plurality of openings by patterning the mask layer comprises using one or more methods among electron beam lithography, photolithography, laser interference lithography, nano-imprinting, and a template.

19. The method of claim 12 or 13, further comprising:
    forming a second electrode layer on a surface of the carbon layer after forming the light-emitting structure layer.

20. The method of claim 12 or 13, wherein the light-emitting structure layer comprises an n-type semiconductor layer, a p-type semiconductor layer, and a quantum active layer disposed between the n-type semiconductor layer and the p-type semiconductor layer.

21. The method of claim 12 or 13, wherein the thin-film layer comprises an n-type semiconductor layer, and the light-emitting structure layer comprises a quantum active layer and a p-type semiconductor layer.

22. The method of claim 12 or 13, wherein the microstructures comprise a structure selected from the group consisting of a micro-bar, a micro-needle, a micro-tube, and a micro-wall.

* * * * *